(12) United States Patent
Watanabe

(10) Patent No.: US 10,072,930 B2
(45) Date of Patent: Sep. 11, 2018

(54) ANGULAR VELOCITY SENSOR

(71) Applicant: Murata Manufacturing Co., Ltd., Nagaokakyo-shi, Kyoto-fu (JP)

(72) Inventor: Kosuke Watanabe, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 617 days.

(21) Appl. No.: 14/714,415

(22) Filed: May 18, 2015

(65) Prior Publication Data
US 2015/0247726 A1  Sep. 3, 2015

Related U.S. Application Data

(63) Continuation of application No. PCT/JP2013/080740, filed on Nov. 14, 2013.

(30) Foreign Application Priority Data

Nov. 19, 2012 (JP) ................................ 2012-253485

(51) Int. Cl.
| | |
|---|---|
| *G01C 19/5642* | (2012.01) |
| *H01L 41/113* | (2006.01) |
| *G01C 19/5656* | (2012.01) |

(52) U.S. Cl.
CPC ..... *G01C 19/5642* (2013.01); *G01C 19/5656* (2013.01); *H01L 41/1132* (2013.01)

(58) Field of Classification Search
CPC .................................................. G01C 19/5642
See application file for complete search history.

(56) References Cited

U.S. PATENT DOCUMENTS

| | | | | |
|---|---|---|---|---|
| 6,378,369 B1* | 4/2002 | Takata | ............... | G01C 19/5719 73/504.12 |
| 2003/0131664 A1* | 7/2003 | Mochida | ............ | G01C 19/5719 73/504.12 |
| 2010/0218604 A1 | 9/2010 | Terada | | |

FOREIGN PATENT DOCUMENTS

| | | |
|---|---|---|
| JP | 2011-158319 A | 8/2011 |
| WO | 2008/023566 A1 | 2/2008 |
| WO | 2013/108804 A1 | 7/2013 |

OTHER PUBLICATIONS

Official Communication issued in International Patent Application No. PCT/JP2013/080740, dated Dec. 10, 2013.

* cited by examiner

*Primary Examiner* — Lisa Caputo
*Assistant Examiner* — Alex Devito
(74) *Attorney, Agent, or Firm* — Keating & Bennett, LLP

(57) ABSTRACT

A vibrator of an angular velocity sensor includes detection beam portions extending from a central base portion in a cross shape, and drive beam portions between and connected to two adjacent detection beam portions. Each of the detection beam portions includes a base-end detection beam connected to the central base portion, and a left detection beam and a right detection beam. The left detection beam is connected to one of the drive beam portions that is located on the left of the corresponding one of the detection beam portions, and the right detection beam is connected to one of the drive beam portions that is located on the right of the corresponding one of the detection beam portions. The drive beam portions are driven to vibrate in a direction toward the central base portion and a direction away from the central base portion so that each two facing ones of the drive beam portions are in the same phase and each two adjacent ones of the drive beam portions are in the opposite phases.

18 Claims, 4 Drawing Sheets

ANGULAR VELOCITY SENSOR

BACKGROUND OF THE INVENTION

1. Field of the Invention

The present invention relates to an angular velocity sensor that measures angular velocity based on a Coriolis force. In particular, the present invention relates to an angular velocity sensor that drives a vibrator so as to vibrate in an in-plane direction of a plate surface of the vibrator and that measures angular velocities based on detected in-plane-direction or out-of-plane-direction vibration generated by a Coriolis force.

2. Description of the Related Art

First, examples of a configuration of a known angular velocity sensor are described. Following, an axis extending along a direction (thickness direction) perpendicular to a plate surface of an angular velocity sensor is assumed to be the z-axis of a Cartesian coordinate system. Meanwhile, two axes that extend along the plate surface and are orthogonal to each other are assumed to be the x-axis and the y-axis of the Cartesian coordinate system.

FIG. 4A is an xy-plane plan view of an angular velocity sensor 101 according to a first known example (see International Publication No. 2008/023566, for example).

The angular velocity sensor 101 includes a support part 102, four second arms 103A, 103B, 103C, and 103D, four weight parts 104, two first arms 105, two third arms 106, four fixing parts 107, a drive part 108, a detection part 109, and sensing parts 110 and 111. The support part 102 is disposed at the center of the xy-plane. An end of each of the second arms 103A to 103D is connected to the support part 102. Two of the second arms 103A to 103D extend from the support part in a direction away from the center so as to be parallel to each other in the direction of the y-axis, are bent near respective tips so as to extend parallel to the x-axis in respective directions away from the center, and are further bent so as to extend parallel to the y-axis in a direction toward the center; the other two of the second arms 103A to 103D extend from the support part in the opposite direction away from the center so as to be parallel to each other in the direction of the y-axis, are bent near respective tips so as to extend parallel to the x-axis in respective directions away from the center, and are further bent so as to extend parallel to the y-axis in the opposite direction toward the center. The four weight parts 104 are connected to the respective tips of the four second arms 103A to 103D. An end of each of the two first arms 105 is connected to the support part 102 and extends parallel to the x-axis. Each of the two third arms 106 extends parallel to the y-axis, and the center of the third arm 106 is connected to the other end of a corresponding one of the first arms 105. Two of the four fixing parts 107 are connected to the two respective ends of a corresponding one of the two third arms 106, whereas the other two of the four fixing parts 107 are connected to the two respective ends of the other one of the two third arms 106. The drive part 108 is provided to the second arm 103A and has a function of driving the four second arms 103A to 103D and the four weight parts 104 so that the four second arms 103A to 103D and the four weighting parts 104 vibrate along the x-axis. The detection part 109 is provided to the second arm 103B and has the function of detecting a drive vibration state. The sensing parts 110 and 111 are respectively provided to the second arms 103C and 103D and each have the function of sensing distortion of a corresponding one of the second arms 103C and 103D.

FIG. 4B is a perspective view of an angular velocity sensor 201 according to a second known example (see Japanese Unexamined Patent Application Publication No. 2011-158319, for example).

The angular velocity sensor 201 includes a base part 202, detection beams 203A to 203D, and a frame body 206. The base part 202 is located at the center of a plate surface of the angular velocity sensor 201. The detection beams 203A to 203D individually extend from the base part 202 in a cross shape. One end of each of the detection beams 203A to 203D is connected to the base part 202. The other end of each of the detection beams 203A to 203D is connected to the frame body 206. The frame body 206 has a substantially square shape in a plan view and includes corners 204A to 204D, which are located at the respective apexes of the substantial square, and drive beams 205A to 205D, which connect the corners 204A to 204D. Masses 207A to 207D are respectively attached to the drive beams 205A to 205D. Each of the masses 207A to 207D includes a pair of auxiliary masses, which are provided so that a corresponding one of the drive beams 205A to 205D is located therebetween. The pairs of auxiliary masses, which constitute the respective masses 207A to 207D, are connected to respective central portions of the drive beams 205A to 205D.

Piezoelectric drive elements 210 to 213 are provided on the respective surfaces of the drive beams 205A to 205D. Each of the piezoelectric drive elements 210 to 213 includes a pair of piezoelectric elements. The piezoelectric elements, which constitute each of the piezoelectric drive elements 210 to 213, are disposed parallel to each other in the extending direction of a corresponding one of the drive beams 205A to 205D. The piezoelectric drive elements 210 to 213 expand and contract upon application of a drive voltage. The drive beams 205A to 205D are respectively driven by the piezoelectric drive elements 210 to 213 and vibrate along the xy-plane so as to be alternately displaced in the direction toward the base part 202 and in the direction away from the base part 202. The drive vibrations of the drive beams 205A to 205D are excited in the same phase.

Piezoelectric detection elements 214 to 217 are provided on the respective surfaces of the detection beams 203A to 203D. Each of the piezoelectric detection elements 214 to 217 includes a pair of piezoelectric elements. The piezoelectric elements, which constitute each of the piezoelectric detection elements 214 to 217, are disposed parallel to each other in the extending direction of a corresponding one of the detection beams 203A to 203D. When an angular velocity acts on the angular velocity sensor 201, the detection beams 203A to 203D vibrate by the action of a Coriolis force. The piezoelectric detection elements 214 to 217 respectively detect vibrations of the detection beams 203A to 203D. More specifically, when an angular velocity in the direction around the z-axis acts on the angular velocity sensor 201 in a state where the drive beams 205A to 205D are being driven to vibrate, a Coriolis force acts in a direction perpendicular to the direction in which the angular velocity and the drive vibration direction is generated in the masses 207A to 207D. In other words, a Coriolis force is generated in the direction parallel to the direction in which each of the drive beams 205A to 205D extends in a stationary state. The masses 207A to 207D are displaced (detection vibrations) by the action of the Coriolis force. The detected vibrations of the masses 207A to 207D are respectively transmitted to the detection beams 203A to 203D via the drive beams 205A to 205D and the corners 204A to 204D in order to cause the detection beams 203A to 203D to vibrate.

The vibrations of the detection beams 203A to 203D are detected by the piezoelectric detection elements 214 to 217.

The above-described angular velocity sensor 101 is capable of measuring the angular velocities around the y-axis and the z-axis but is incapable of measuring the angular velocity around the x-axis. For this reason, in order to measure the angular velocity around each of all of the x-axis, y-axis, and z-axis, an angular velocity sensor for measuring the angular velocity around the x-axis needs to be additionally provided. This causes a problem such as an increase in package size and an increase in cost. The angular velocity sensor 101 also has the following problems. When the angular velocity around the z-axis acts on the angular velocity sensor 101, the vibrations of the weights apply torque to the support part, and the detection vibrations escape from the vibrator instead of being kept within the vibrator. In this case, the beams are not efficiently deformed, consequently reducing the detection sensitivity of the angular velocity sensor 101. In addition, the above-mentioned detection vibrations may be caused by a stress or vibrations acting on an external structure, or the characteristics of the angular velocity sensor 101 may change due to changes in temperature or stress on the base, consequently reducing the detection accuracy of the angular velocity sensor 101.

Meanwhile the above-described angular velocity sensor 201 has the following problem. Specifically, when the angular velocity acts around the z-axis, the vibrations of the weights apply torque to the support part, and the detection vibrations escape from the vibrator instead of being kept within the vibrator. In this case, the beams are not efficiently deformed, consequently reducing the detection sensitivity and the detection accuracy of the angular velocity sensor 201.

SUMMARY OF THE INVENTION

In view of these circumstances, preferred embodiments of the present invention provide an angular velocity sensor configured to measure the angular velocity around each of axes of a Cartesian coordinate system without increasing a package size or cost. The angular velocity sensor is configured to keep, within a vibrator, detection vibrations generated by the angular velocity around the axis that is perpendicular to a plate surface of the vibrator and hence has high detection sensitivity and high detection accuracy.

An angular velocity sensor according to a preferred embodiment of the present invention measures an angular velocity based on detected vibrations generated by the action of a Coriolis force in a vibrator driven and vibrating along a plate surface of the vibrator. The vibrator includes a central base portion, four detection beam portions, and four drive beam portions. The central base portion is fixed at a center of the plate surface. The four detection beam portions are equiangularly arranged and extend from the central base portion in respective radial directions in the plate surface. Each of the four drive beam portions is connected to adjacent ones of the four detection beam portions so as to be located between the adjacent detection beam portions and includes a weight. Each of the four detection beam portions includes a base-end detection beam, a first-direction-side detection beam, and a second-direction-side detection beam. The base-end detection beam is connected, at a radial-direction inner end portion thereof, to the central base portion. The first-direction-side detection beam is connected, at a radial-direction inner end portion thereof, to the base-end detection beam and connected, at a radial-direction outer end portion thereof, to one of the drive beam portions that is adjacent to the detection beam portion in a first direction. The second-direction-side detection beam is connected, at a radial-direction inner end portion thereof, to the base-end detection beam and connected, at a radial-direction outer end portion, to one of the drive beam portions that is adjacent to the detection beam portion in a second direction. The first direction is perpendicular or substantially perpendicular to the radial direction in the plate surface. The second direction is opposite to the first direction. The vibrator is driven to vibrate so that the four drive beam portions are displaced in the respective radial directions and so that each two of the drive beam portions facing each other are in an identical phase and each two adjacent ones of the drive beam portions are in opposite phases.

With this configuration, detection vibrations based on the angular velocities around the three respective axes of a Cartesian coordinate system are individually detected. In addition, in detection vibrations based on an angular velocity around an axis (z-axis) perpendicular or substantially perpendicular to the plate surface, each two adjacent drive beam portions vibrate so as to rotate in opposite directions in the plate surface and the detection beam portions vibrate so that the first-direction-side detection beam and the second-direction-side detection beam curve in opposite directions so as to come close to each other and become away from each other. Since such vibrations, in which the first-direction-side detection beam and the second-direction-side detection beam come close to each other and become away from each other, cancel each other out in the base-end detection beam, vibrations transmitted from the detection beam portions to the central base portion are significantly reduced. Moreover, such vibrations, in which the first-direction-side detection beam and the second-direction-side detection beam come close to each other and become spaced away from each other, are different from the vibrations generated with such known configurations, in which two drive beams are connected to the respective sides of a single detection beam. As a result, the deformation amount of each detection beam is large, consequently increasing the detection sensitivity of the angular velocity sensor. In this way, the sensitivity of the angular velocity sensor to angular velocity is significantly improved. Moreover, the above-described detection vibrations are unlikely to be caused as a result of vibrations or deformation of the external structure, and hence the detection accuracy of the angular velocity sensor is improved. Further, changes in characteristics due to changes in stress acting on the external structure or temperature changes are reduced.

Preferably, the above angular velocity sensor detects a detection vibration of the vibrator in which the four drive beam portions rotate around an axis perpendicular or substantially perpendicular to the plate surface and in which each two of the drive beam portions facing each other are in an identical phase and each two ones of the adjacent drive beam portions are in opposite phases.

With this configuration, the angular velocity around an axis (z-axis) perpendicular or substantially perpendicular to the plate surface is able to be measured separately from the angular velocities around an axis (x-axis or y-axis) along the plate surface.

Preferably, the above angular velocity sensor detects a detection vibration of the vibrator in which each two of the drive beam portions facing each other are displaced in a direction perpendicular or substantially perpendicular to the plate surface.

With this configuration, the angular velocity around an axis (x-axis or y-axis) along the plate surface is able to be measured separately from the angular velocity around an axis (z-axis) perpendicular or substantially perpendicular to the plate surface.

Preferably, an angular velocity sensor according to a preferred embodiment of the present invention includes a piezoelectric drive element that drives the vibrator to cause the vibrator to vibrate; and a piezoelectric detection element that detects the detection vibration of the vibrator.

With this configuration, piezoelectric elements are used as a drive unit and detection unit such that the size of the angular velocity sensor is reduced.

Preferably, an angular velocity sensor according to a preferred embodiment of the present invention includes a piezoelectric monitoring element that detects a drive vibration of the vibrator in order to control a drive voltage of the piezoelectric drive element.

With this configuration, the piezoelectric monitoring element detects a signal corresponding to the drive vibration, and feedback control is performed on a drive voltage by using the signal such that steady drive vibrations are generated. Hence, the accuracy of the detection sensitivity of the angular velocity sensor is improved. In addition, using piezoelectric elements reduces the size of the angular velocity sensor.

Preferably, the vibrator includes a single substrate, or base material.

With this configuration, multiple angular velocity sensors is able to be efficiently manufactured by subjecting a wafer to surface processing.

Preferably, the substrate is made of a semiconductor wafer.

With this configuration, the angular velocity sensor is able to be easily manufactured since the techniques of shape processing and the performance of manufacturing equipment are fully developed.

According to various preferred embodiments of the present invention, the angular velocities around the three respective axes of a Cartesian coordinate system are able to be individually measured. In addition, detection vibrations generated in the first-direction-side detection beams and the second-direction-side detection beams based on the angular velocity around the axis (z-axis) perpendicular or substantially perpendicular to the plate surface are less likely to be transmitted to the base-end detection beams, and the first-direction-side detection beams and the second-direction-side detection beams are deformed largely. This improves the sensitivity of the angular velocity sensor to the detection of angular velocities. Moreover, the above-described detection vibrations are unlikely to be generated as a result of vibrations or deformation of the external structure such that the detection accuracy of the angular velocity sensor is improved. Further, changes in characteristics due to a stress acting on the external structure and temperature changes are reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following description, two axes that extend along a plate surface of a vibrator and that are perpendicular or substantially perpendicular to each other are set as the x-axis and the y-axis of a Cartesian coordinate system. Moreover, an axis that is perpendicular or substantially perpendicular to the plate surface of the vibrator is set as the z-axis of the Cartesian coordinate system.

In addition, in the following description, a direction that is perpendicular or substantially perpendicular to a radial direction from the center of the plate surface of the vibrator in the plate surface and that is obtained by rotating the radial direction in a counterclockwise direction is set as a first direction. A direction that is perpendicular or substantially perpendicular to a radiation direction and that is obtained by rotating the radiation direction in a clockwise direction is set as a second direction. A description is given below referring to the first direction as left direction; the second direction, right direction; a first-direction side, left; a second-direction side, second.

Figure 1A:
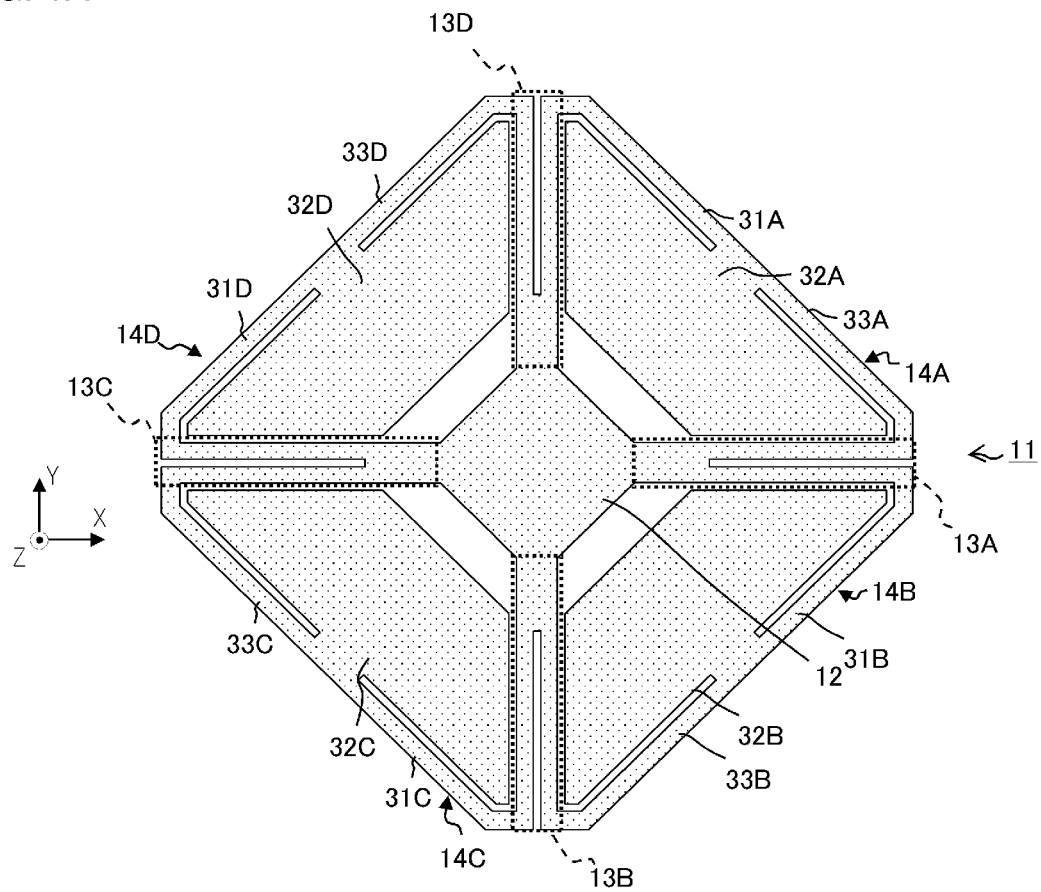
FIGS. 1A and 1B provides diagrams illustrating a vibrator included in an angular velocity sensor according to a first preferred embodiment of the present invention.

FIG. 1A is an xy-plane plan view illustrating a vibrator 11 included in an angular velocity sensor 10 according to a first preferred embodiment of the present invention.

The vibrator 11 is supported by an unillustrated support substrate. The support substrate is made of, for example, a ceramic, resin, silicon, or glass material and includes a plate surface that is parallel or substantially parallel to plate surfaces of the vibrator 11.

The vibrator 11 includes plate surfaces on the z-axis-positive-direction side and the z-axis-negative-direction side, each of the plate surfaces being located along the x-axis and the y-axis. The vibrator 11 is manufactured as follows. Openings are formed in a semiconductor silicon wafer preferably by etching so as to each penetrate the semiconductor silicon wafer in the thickness direction thereof, that is, parallel or substantially parallel to the z-axis, and multiple vibrators 11 are cut out from the semiconductor silicon wafer.

The vibrator 11 has a rotationally symmetric shape with four-fold rotational symmetry in a plan view of a corresponding one of the plate surfaces. The vibrator 11 includes a central base portion 12, detection beam portions 13A, 13B, 13C, and 13D, and drive beam portions 14A, 14B, 14C, and 14D.

The central base portion 12 is located at the center of the vibrator 11 in a plan view of the plate surface. At least one of a z-axis-positive-direction-side surface and a z-axis-negative-direction-side surface of the central base portion 12 is fixed to an external structure via the unillustrated support substrate. The central base portion 12 supports the detection beam portions 13A to 13D and the drive beam portions 14A to 14D so as to keep the detection beam portions 13A to 13D and the drive beam portions 14A to 14D lifted from the support substrate.

More specifically, in a plan view of the plate surface, the central base portion 12 preferably has a square or substantially square shape with a side oriented at a clockwise angle of 45 degrees, a side oriented at a clockwise angle of 135 degrees, a side oriented at a clockwise angle of 225 degrees, and a side oriented at a clockwise angle of 315 degrees to the y-axis positive direction (the same applies to the angles described below), for example.

In a plan view of the plate surface, the detection beam portions 13A to 13D are arranged in a cross shape having the central base portion 12 at the center thereof. In other words, the detection beam portions 13A to 13D are equiangularly arranged and extend in respective radial directions on the plate surface. A corresponding one of a z-axis-positive-direction-side surface and a z-axis-negative-direction-side surface of each of the detection beam portions 13A to 13D faces the plate surface of the support substrate with a space therebetween.

More specifically, the detection beam portion 13A is connected to a corner of the central base portion 12, the corner being oriented at an angle of 90 degrees, and extends in the radial direction from the corner at which the detection beam portion 13A is connected to the central base portion 12, that is, in the 90-degree direction. The detection beam portion 13B is connected to a corner of the central base portion 12, the corner being oriented at an angle of 180 degrees, and extends in the radial direction from the corner at which the detection beam portion 13B is connected to the central base portion 12, that is, in the 180-degree direction. The detection beam portion 13C is connected to a corner of the central base portion 12, the corner being oriented at an angle of 270 degrees, and extends in the radial direction from the corner at which the detection beam portion 13C is connected to the central base portion 12, that is, in the 270-degree direction. The detection beam portion 13D is connected to a corner of the central base portion 12, the corner being oriented at an angle of 360 degrees, and extends in the radial direction from the corner at which the detection beam portion 13D is connected to the central base portion 12, that is, in the 360-degree direction.

Each of the drive beam portions 14A to 14D is located between and connected to adjacent ones of the detection beam portions 13A to 13D. A corresponding one of a z-axis-positive-direction-side surface and a z-axis-negative-direction-side surface of each of the drive beam portions 14A to 14D faces the plate surface of the support substrate with a space therebetween.

More specifically, in a plan view of the plate surface, the drive beam portion 14A is oriented at an angle of 45 degrees to the central base portion 12 and includes a drive beam 31A, a weight 32A, and a drive beam 33A. The drive beam 31A extends in the 135-degree direction. An x-axis-negative-direction-side end portion of the drive beam 31A is bent and perpendicular or substantially perpendicularly connected to the detection beam portion 13D, and an x-axis-positive-direction-side end portion of the drive beam 31A is connected to the weight 32A. The drive beam 33A extends in the 135-degree direction. An x-axis-positive-direction-side end portion of the drive beam 33A is bent and perpendicular or substantially perpendicularly connected to the detection beam portion 13A, and an x-axis-negative-direction-side end portion of the drive beam 33A is connected to the weight 32A. The weight 32A is located between and connected to the drive beam 31A and the drive beam 33A. The weight 32A is disposed so as to cover a major portion of the region surrounded by the detection beam portion 13A, the detection beam portion 13D, and the drive beam portion 14A on the radial-direction inner side of the drive beam 31A and the drive beam 33A.

In a plan view of the plate surface, the drive beam portion 14B is oriented at an angle of 135 degrees to the central base portion 12 and includes a drive beam 31B, a weight 32B, and a drive beam 33B. The drive beam 31B extends in the 45-degree direction. A y-axis-positive-direction-side end portion of the drive beam 31B is bent and perpendicular or substantially perpendicularly connected to the detection beam portion 13A, and a y-axis-negative-direction-side end portion of the drive beam 31B is connected to the weight 32B. The drive beam 33B extends in the 45-degree direction. A y-axis-negative-direction-side end portion of the drive beam 33B is bent and perpendicular or substantially perpendicularly connected to the detection beam portion 13B, and a y-axis-positive-direction-side end portion of the drive beam 33B is connected to the weight 32B. The weight 32B is located between and connected to the drive beam 31B and the drive beam 33B. The weight 32B is disposed so as to cover a major portion of the region surrounded by the detection beam portion 13B, the detection beam portion 13A, and the drive beam portion 14B on the radial-direction inner side of the drive beam 31B and the drive beam 33B.

In a plan view of the plate surface, the drive beam portion 14C is oriented at an angle of 225 degrees to the central base portion 12 and includes a drive beam 31C, a weight 32C, and a drive beam 33C. The drive beam 31C extends in the 135-degree direction. An x-axis-positive-direction-side end portion of the drive beam 31C is bent and perpendicular or substantially perpendicularly connected to the detection beam portion 13B, and an x-axis-negative-direction-side end portion of the drive beam 31C is connected to the weight 32C. The drive beam 33C extends in the 135-degree direction. An x-axis-negative-direction-side end portion of the drive beam 33C is bent and perpendicular or substantially perpendicularly connected to the detection beam portion 13C, and an x-axis-positive-direction-side end portion of the drive beam 33C is connected to the weight 32C. The weight 32C is located between and connected to the drive beam 31C and the drive beam 33C. The weight 32C is disposed so as to cover a major portion of the region surrounded by the detection beam portion 13C, the detection beam portion 13B, and the drive beam portion 14C on the radial-direction inner side of the drive beam 31C and the drive beam 33C.

In a plan view of the plate surface, the drive beam portion 14D is oriented at an angle of 315 degrees to the central base portion 12 and includes a drive beam 31D, a weight 32D, and a drive beam 33D. The drive beam 31D extends in the 45-degree direction. A y-axis-negative-direction-side end portion of the drive beam 31D is bent and perpendicular or substantially perpendicularly connected to the detection beam portion 13C, and a y-axis-positive-direction-side end portion of the drive beam 31D is connected to the weight 32D. The drive beam 33D extends in the 45-degree direction. A y-axis-positive-direction-side end portion of the drive beam 33D is bent and perpendicular or substantially perpendicularly connected to the detection beam portion 13D, and a y-axis-negative-direction-side end portion of the drive beam 33D is connected to the weight 32D. The weight 32D is located between and connected to the drive beam 31D and the drive beam 33D. The weight 32D is disposed so as to cover a major portion of the region surrounded by the detection beam portion 13D, the detection beam portion 13C, and the drive beam portion 14D on the radial-direction inner side of the drive beam 31D and the drive beam 33D.

Figure 1B:
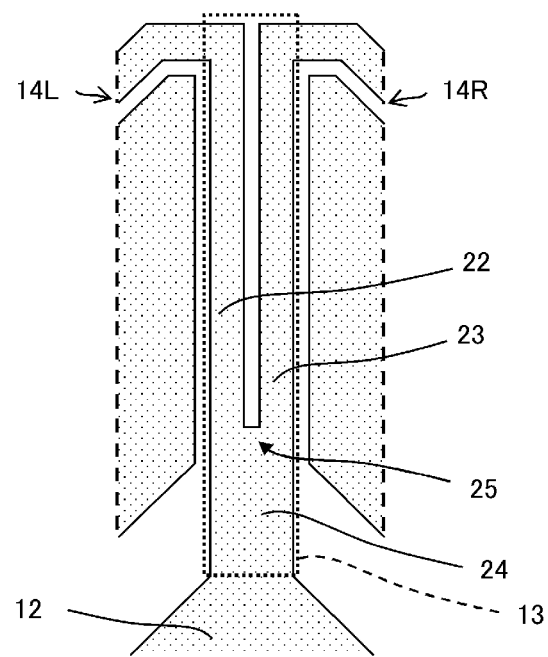

FIG. 1B is an xy-plane plan view illustrating a structure around each of the detection beam portions 13A to 13D. With regard to the reference signs in FIG. 1B, the detection beam portions 13A to 13D are collectively changed to a detection beam portion 13. Moreover, one of the drive beam portions 14A to 14D that is located on the left of the detection beam portion 13 is changed to the drive beam portion 14L, and one of the drive beam portions 14A to 14D that is located on the right of the detection beam portion 13 is changed to the drive beam portion 14R.

The detection beam portion 13 includes a left detection beam 22, a right detection beam 23, a base-end detection beam 24, and a joining portion 25. The left detection beam 22, the right detection beam 23, and the base-end detection beam 24 are connected to each other via the joining portion 25. The base-end detection beam 24 extends in the radial direction of the detection beam portion 13. A radial-direction inner-side end portion of the base-end detection beam 24 is connected to the central base portion 12, and a radial-direction outer-side end portion of the base-end detection beam 24 is connected to the left detection beam 22 and the right detection beam 23 via the joining portion 25. The left detection beam 22 extends in the radial direction of the detection beam portion 13. A radial-direction inner-side end portion of the left detection beam 22 is connected to the base-end detection part 24 via the joining portion 25, and a radial-direction outer-side end portion of the left detection beam 22 is connected to the drive beam portion 14L. The right detection beam 23 extends in the radial direction of the detection beam portion 13 and is adjacent to the right of the left detection beam 22. A radial-direction inner-side end portion of the right detection beam 23 is connected to the base-end detection beam 24 via the joining portion 25, and a radial-direction outer-side end portion of the right detection beam 23 is connected to the drive beam portion 14R.

With regard to the shape of the base-end detection beam 24, the width of the base-end detection beam 24 in the direction perpendicular or substantially perpendicular to the radial direction thereof may be the same as or different from the width of the joining portion 25. However, it is preferable that the width of the base-end detection beam 24 be small, since, for example, the influence of acceleration acting on the support substrate (external structure) is less likely to be transmitted to the detection beam portion 13 via the central base portion 12 in such a case.

The vibrator 11 with such a configuration has a drive vibration mode.

Figure 2:
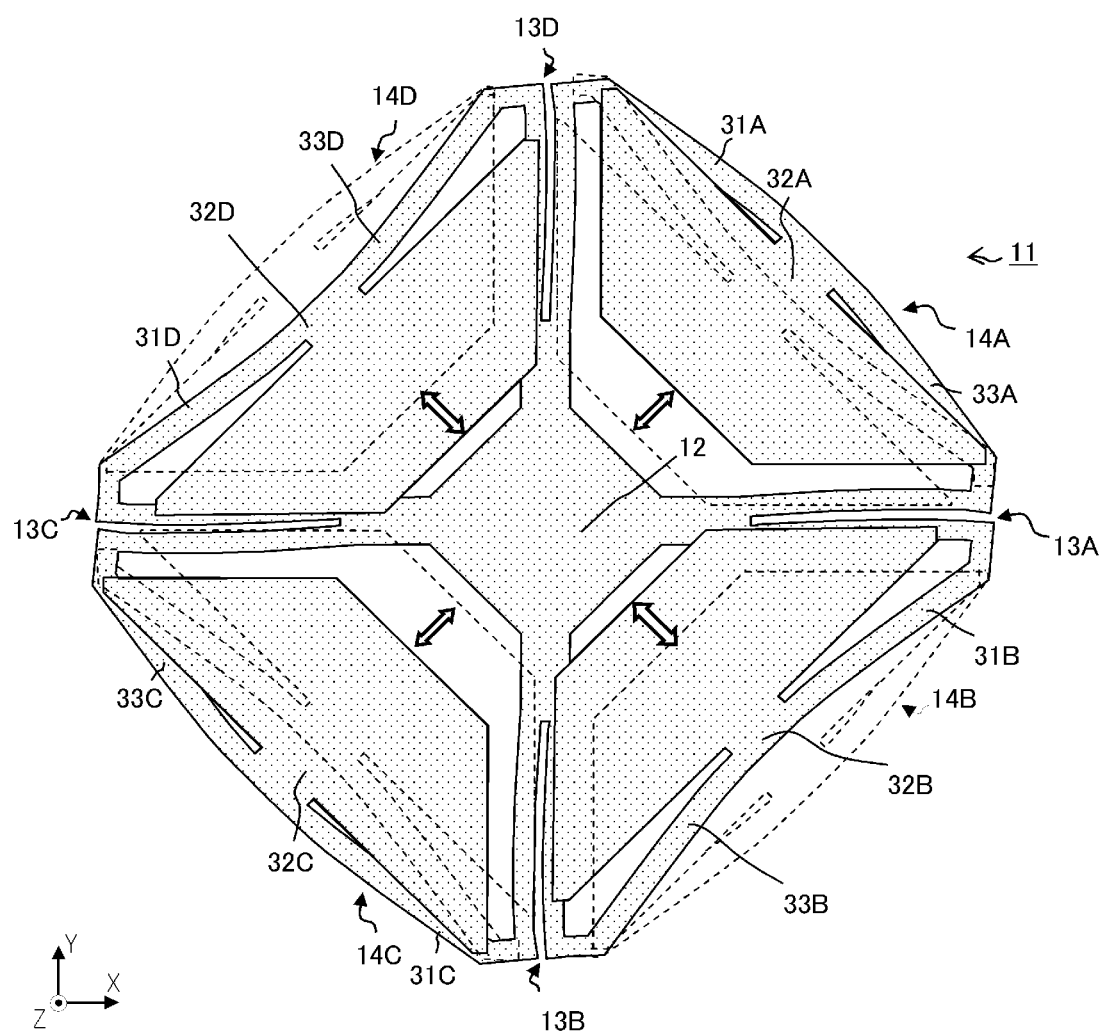
FIG. 2 is a diagram illustrating a drive vibration mode of the vibrator according to the first preferred embodiment of the present invention.

FIG. 2 is an xy-plane plan view illustrating a deformation state of the vibrator 11 in the drive vibration mode. In FIG. 2 described below, the deformation amounts of the respective portions are presented in a more exaggerated manner than the actual amounts.

The drive vibration mode of the angular velocity sensor 10 is started by a drive unit described later. In the drive vibration mode, each of the drive beam portions 14A to 14D is driven to vibrate in the plate surface so as to alternately curve toward the radial-direction inner side and the radial-direction outer side thereof. In this mode, each two of the drive beam portions 14A to 14D that face each other are driven to vibrate in the same phase. In contrast, each two of the drive beam portions 14A to 14D that are adjacent to each other are driven to vibrate in opposite phases.

Next, a description is given of an example of a configuration in which piezoelectric elements are provided to the vibrator 11 as a drive unit and a detection unit in the angular velocity sensor 10 according to the first preferred embodiment. Note that electrostatic forces or electrostatic capacities may be used as the drive unit and the detection unit instead of piezoelectric elements.

Figure 3:
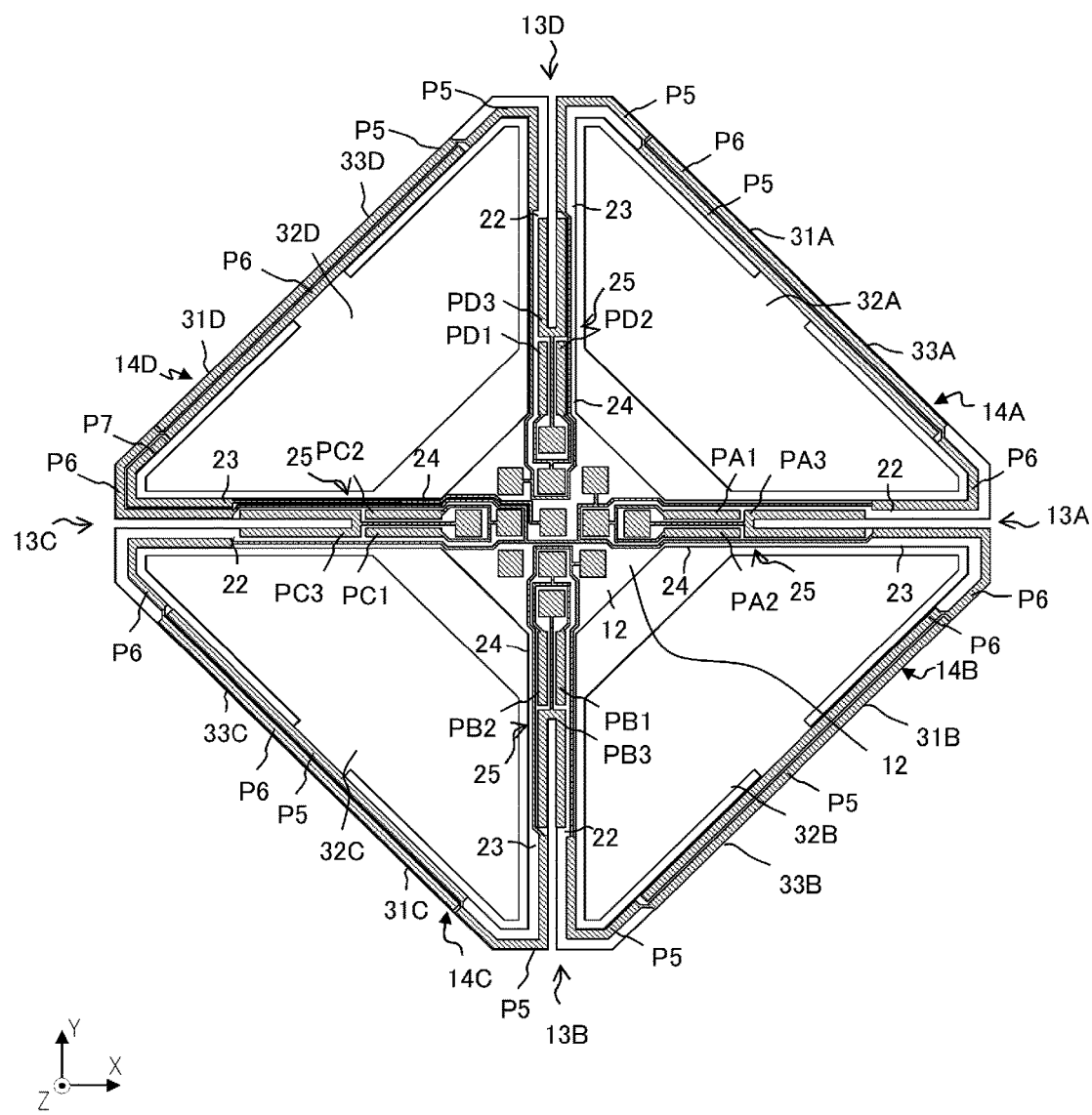
FIG. 3 is a diagram illustrating piezoelectric elements included in the angular velocity sensor according to the first preferred embodiment of the present invention.
Figure 4A:
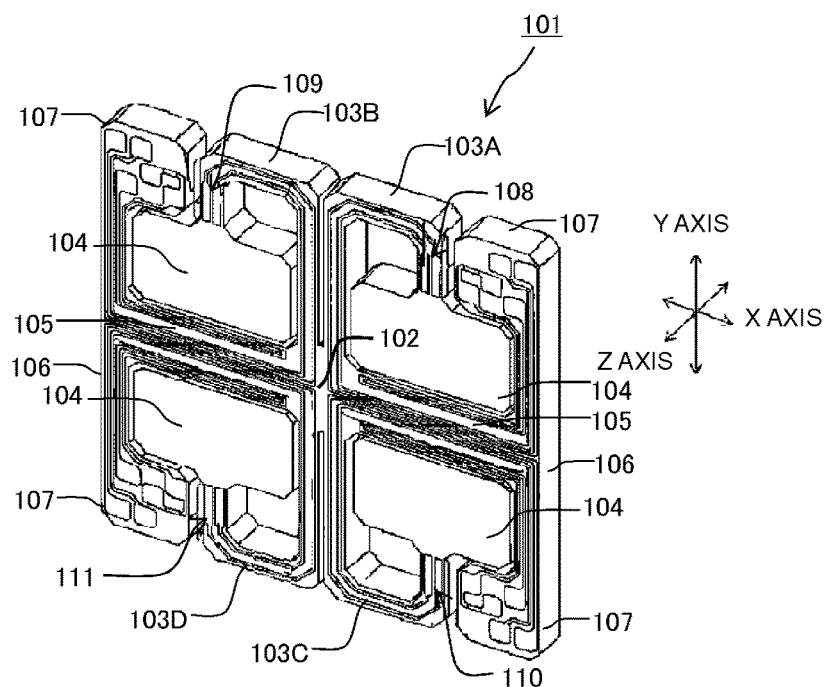
FIGS. 4A and 4B provides diagrams each illustrating an angular velocity sensor according to a known example.
Figure 4B:
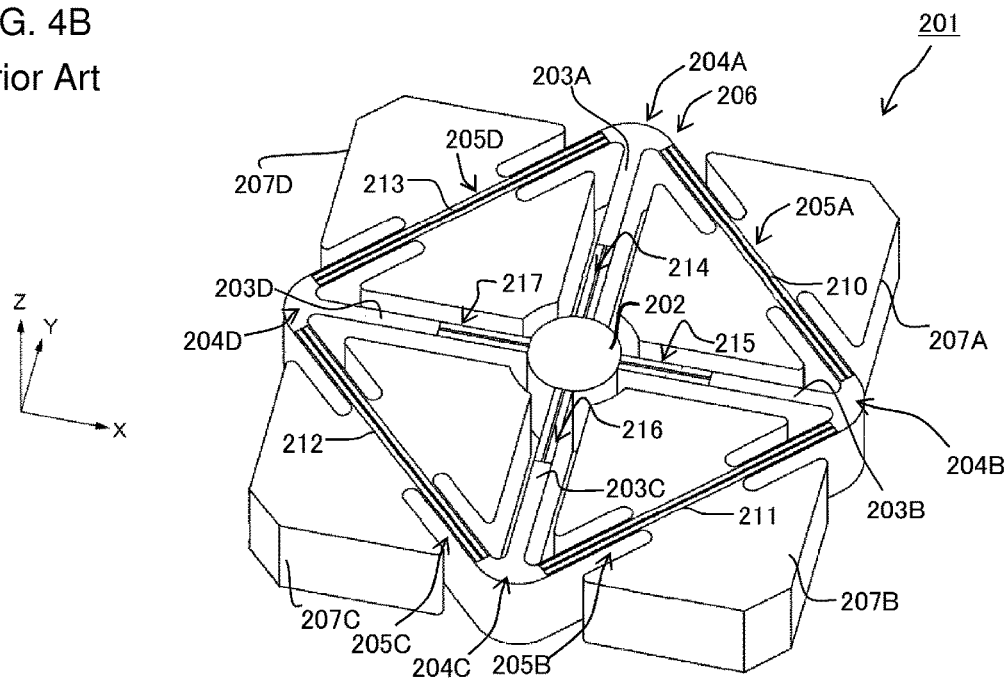

FIG. 3 is an xy-plane plan view of the angular velocity sensor 10.

The angular velocity sensor 10 includes piezoelectric detection elements PA1, PA2, PA3, PB1, PB2, PB3, PC1, PC2, PC3, PD1, PD2, and PD3, piezoelectric drive elements P5 and P6, and a piezoelectric monitoring element P7.

Each of the piezoelectric elements PA1 to PA3, PB1 to PB3, PC1 to PC3, PD1 to PD3, and P5 to P7 is provided on the plate surface of the vibrator 11 and includes an upper electrode, a lower electrode, and a piezoelectric body layer. The piezoelectric body layer is a thin film made from a piezoelectric material such as aluminum nitride, lead zirconium titanate, potassium sodium niobate, or zinc oxide. Each of the upper electrode and the lower electrode is made from, for example, titanium, gold, palladium, or iridium, or an alloy of two or more of the above. The lower electrode is provided on a lower surface of the piezoelectric body layer and grounded. The upper electrode is provided on an upper surface of the piezoelectric body layer and coupled with an unillustrated circuit element via a wiring electrode and a land electrode. Each of the wiring electrode and the land electrode may be provided as a single-layer electrode or may be provided as a piezoelectric element including a piezoelectric body layer. The lower electrode is unnecessary when the vibrator has electrical conductivity.

More specifically, in the drive beam portion 14A, a portion of the piezoelectric drive element P5 around the x-axis-negative-direction-side end portion of the drive beam portion 14A is disposed in a radial-direction outer region, and a portion of the piezoelectric drive element P5 around the center of the drive beam portion 14A is disposed in a radial-direction inner region. Meanwhile, a portion of the piezoelectric drive element P6 around the center of the drive beam portion 14A is disposed in the radial-direction outer region, and a portion of the piezoelectric drive element P6 around the x-axis-positive-direction-side end portion of the drive beam portion 14A is disposed in the radial-direction inner region.

In the drive beam portion 14B, a portion of the piezoelectric drive element P5 around the y-axis-positive-direction-side end portion of the drive beam portion 14B is disposed in a radial-direction outer region, and a portion of the piezoelectric drive element P5 around the center of the drive beam portion 14B is disposed in a radial-direction inner region. Meanwhile, a portion of the piezoelectric drive element P6 around the center of the drive beam portion 14B is disposed in the radial-direction outer region, and a portion of the piezoelectric drive element P6 around the y-axis-positive-direction-side end portion of the drive beam portion 14B is disposed in the radial-direction inner region.

In the drive beam portion 14C, a portion of the piezoelectric drive element P5 around the x-axis-positive-direction-side end portion of the drive beam portion 14C is disposed in a radial-direction outer region, and a portion of the piezoelectric drive element P5 around the center of the drive beam portion 14C is disposed in a radial-direction inner region. Meanwhile, a portion of the piezoelectric drive element P6 around the center of the drive beam portion 14C is disposed in the radial-direction outer region, and a portion of the piezoelectric drive element P6 around the x-axis-negative-direction-side end portion of the drive beam portion 14C is disposed in the radial-direction inner region.

In the drive beam portion 14D, a portion of the piezoelectric drive element P5 around the y-axis-negative-direction-side end portion of the drive beam portion 14D is disposed in a radial-direction outer region, and a portion of the piezoelectric drive element P5 around the center of the drive beam portion 14D is disposed in a radial-direction inner region. Meanwhile, a portion of the piezoelectric drive element P6 around the center of the drive beam portion 14D is disposed in the radial-direction outer region, and a portion of the piezoelectric drive element P6 around the y-axis-positive-direction-side end portion of the drive beam portion 14D is disposed in the radial-direction inner region.

Anti-phase alternating voltages are applied to the respective piezoelectric drive elements P5 and P6. With this application, the vibrator 11 vibrates in the drive vibration mode as illustrated in FIG. 2.

Note that the arrangement of the piezoelectric drive elements P5 and P6 provided here is merely a non-limiting example. The piezoelectric drive elements P5 and P6 may be arranged in any manner as long as such vibrations in the drive vibration mode illustrated in FIG. 2 can be generated with the arrangement. It is preferable to decide the arrangement of the piezoelectric drive elements P5 and P6 based on the polarities of distortions that occur in each of the drive beam portions in the drive vibration mode. Specifically, since the polarities of the distortions occurring in the radial-direction inner region and the radial-direction outer region of each of the drive beam portions are different, the regions being divided at the width-direction center of the drive beam portion, it is preferable that the piezoelectric drive element P5 be disposed in one of the radial-direction inner region and the radial-direction outer region and the piezoelectric drive element P6 be disposed in the other region. Moreover, the polarities of distortions occurring in the portion around the extending-direction center of the drive beam portion and the portions around the respective extending-direction end portions of the drive beam portion of each of the drive beam portions are different. For this reason, it is preferable that the piezoelectric drive element P5 be disposed in either a region around the center or regions around the respective end portions of the drive beam and the piezoelectric drive element P6 be disposed in the other. Further, it is not necessary to provide both the piezoelectric drive element P5 and the piezoelectric drive element P6, and only one of them may be provided.

The piezoelectric monitoring element P7 is provided for feedback control of a drive voltage and measures a voltage corresponding to drive vibrations. The piezoelectric monitoring element P7 is disposed in the radial-direction inner region around the y-axis-negative-direction-side end portion of the drive beam portion 14D and connected to a land electrode via a wiring electrode. Such feedback control of a drive voltage using the piezoelectric monitoring element P7 makes it possible to generate steady detection vibrations, consequently improving the detection sensitivity and the detection accuracy of the angular velocity sensor 10. Note that the piezoelectric monitoring element P7 may be provided in any region in the drive beam portions 14A to 14D as long as the polarity of the distortions occurring in the region in the drive vibration mode is the same. Moreover, multiple piezoelectric monitoring elements P7 may be provided.

The piezoelectric detection elements PA1, PA2, PA3, PB1, PB2, PB3, PC1, PC2, PC3, PD1, PD2, and PD3 are provided in the detection beam portions 13A to 13D and are coupled with a detection circuit (differential amplifier circuit) via wiring electrodes and land electrodes.

The piezoelectric detection elements PA1 and PA2 and the piezoelectric detection elements PC1 and PC2 are provided to measure the angular velocity around the x-axis. The piezoelectric detection element PA1 is disposed in a region on the left of the beam-width-direction center in the base-end detection beam 24 of the detection beam portion 13A and extends in the radial direction of the detection beam portion 13A. The piezoelectric detection element PA2 is disposed in a region on the right of the beam-width-direction center in the base-end detection beam 24 of the detection beam portion 13A and extends in the radial direction of the detection beam portion 13A. The piezoelectric detection element PA1 and the piezoelectric detection element PA2 are coupled with the same land electrode via wiring electrodes. The piezoelectric detection element PC1 is disposed in a region on the left of the beam-width-direction center in the base-end detection beam 24 of the detection beam portion 13C and extends in the radial direction of the detection beam portion 13C. The piezoelectric detection element PC2 is disposed in a region on the right of the beam-width-direction center in the base-end detection beam 24 of the detection beam portion 13C and extends in the radial direction of the detection beam portion 13C. The piezoelectric detection element PC1 and the piezoelectric detection element PC2 are coupled with the same land electrode via wiring electrodes.

When the angular velocity around the x-axis acts on the vibrator 11 vibrating in the drive vibration mode, a Coriolis force in the z-axis direction occurs in the weights 32A to 32D, each of which has a velocity component of the drive vibrations in the y-axis direction perpendicular or substantially perpendicular to the axis around which the angular velocity acts. By the action of the Coriolis force, the vibrator 11 is excited so as to vibrate in a first detection vibration mode.

With respect to the drive vibrations, the weight 32A and the weight 32D vibrate in the respective radial directions in opposite phases and hence have velocity components in the opposite y-axis directions, the y-axis being perpendicular or substantially perpendicular to the z-axis and the x-axis. Accordingly, the directions in which the Coriolis force parallel or substantially parallel to the z-axis acts on the weight 32A and the weight 32D are opposite to each other. The weight 32A and the weight 32C vibrate in the respective radial directions in the same phase and hence have velocity components in the opposite y-axis directions, the y-axis being perpendicular or substantially perpendicular to the z-axis and the x-axis. Accordingly, the directions in which the Coriolis force parallel or substantially parallel to the z-axis acts on the weight 32A and the weight 32C are opposite to each other. In contrast, the weight 32A and the weight 32B vibrate in the respective radial directions in opposite phases and have velocity components in the same y-axis direction, the y-axis being perpendicular or substantially perpendicular to the z-axis and the x-axis. Accordingly, the directions in which the Coriolis force parallel or substantially parallel to the z-axis acts on the weight 32A and the weight 32B are the same. The weight 32C and the weight 32D vibrate in the respective radial directions in opposite phases and have velocity components in the same y-axis direction, the y-axis being perpendicular or substantially perpendicular to the z-axis and the x-axis. Accordingly, the directions in which the Coriolis force parallel or substantially parallel to the z-axis acts on the weight 32C and the weight 32D are the same.

Hence, in the first detection vibration mode started by the angular velocity around the x-axis, the weights 32A and 32B are displaced in the same direction parallel or substantially parallel to the z-axis. Meanwhile, the weight 32C and 32D are displaced in the same direction parallel or substantially parallel to the z-axis. In contrast, the weights 32A and 32B and the weights 32C and 32D are displaced in the opposite directions parallel or substantially parallel to the z-axis. Consequently, the drive beam portions 14A and 14B, to which the respective weights 32A and 32B are provided, vibrate so as to curve in the same direction parallel or substantially parallel to the z-axis. Meanwhile, the drive beam portions 14C and 14D, to which the respective weights 32C and 32D are provided, vibrate so as to curve in the same direction parallel or substantially parallel to the z-axis. In contrast, the drive beam portions 14A and 14B and the drive beam portions 14C and 14D vibrate so as to curve in the opposite directions parallel or substantially parallel to the z-axis.

As a result, the left detection beam 22 and the right detection beam 23 of the detection beam portion 13A connected to the drive beam portion 14A and the drive beam portion 14B therebetween, which curve in the same direction, vibrate so as to curve in the same direction as that of the drive beam portions 14A and 14B parallel or substantially parallel to the z-axis. Meanwhile, the left detection beam 22 and the right detection beam 23 of the detection beam portion 13C connected to the drive beam portion 14C and the drive beam portion 14D therebetween, which curve in the same direction, vibrate so as to curve in the same direction as that of the drive beam portions 14C and 14D parallel or substantially parallel to the z-axis. In contrast, the left detection beam 22 and the right detection beam 23 of the detection beam portion 13A and the left detection beam 22 and the right detection beam 23 of the detection beam portion 13C vibrate so as to curve in the opposite directions parallel or substantially parallel to the z-axis.

As a result, the base-end detection beam 24 of the detection beam 13A and the base-end detection beam 24 of the detection beam 13C vibrate so as to curve in opposite phases. This causes the piezoelectric detection elements PC1 and PC2 to contract when the piezoelectric detection elements PA1 and PA2 expand and causes the piezoelectric detection elements PC1 and PC2 to expand when the piezoelectric detection elements PA1 and PA2 contract. In this way, a voltage having one polarity is generated in the piezoelectric detection elements PA1 and PA2, and a voltage having the opposite polarity is generated in the piezoelectric detection elements PC1 and PC2, in the first detection vibration mode.

By differential amplification between the voltage in the piezoelectric detection elements PA1 and PA2 and the voltage in the piezoelectric detection elements PC1 and PC2, a voltage signal corresponding to the angular velocity around the x-axis is obtained. Note that the piezoelectric detection elements PA1, PA2, PC1, and PC2 may be arranged in any manner as long as such voltages having the opposite polarities can be generated in the first detection vibration mode.

The piezoelectric detection elements PB1 and PB2 and the piezoelectric detection elements PD1 and PD2 are provided to measure the angular velocity around the y-axis. The piezoelectric detection element PB1 is disposed in a region on the left of the beam-width-direction center in the base-end detection beam 24 of the detection beam portion 13B and extends in the radial direction of the detection beam portion 13B. The piezoelectric detection element PB2 is disposed in a region on the right of the beam-width-direction center in the base-end detection beam 24 of the detection beam portion 13B and extends in the radial direction of the detection beam portion 13B. The piezoelectric detection element PB1 and the piezoelectric detection element PB2 are coupled with the same land electrode via wiring electrodes. The piezoelectric detection element PD1 is disposed in a region on the left of the beam-width-direction center in the base-end detection beam 24 of the detection beam portion 13D and extends in the radial direction of the detection beam portion 13D. The piezoelectric detection element PD2 is disposed in a region on the right of the beam-width-direction center in the base-end detection beam 24 of the detection beam portion 13D and extends in the radial direction of the detection beam portion 13D. The piezoelectric detection element PD1 and the piezoelectric detection element PD2 are coupled with the same land electrode via wiring electrodes.

When an angular velocity around the y-axis acts on the vibrator 11 vibrating in the drive vibration mode, the vibrator vibrates in a second detection vibration mode having a vibration state that is shifted by 90 degrees from that in the above-described case, in which the angular velocity around the x-axis acts on the vibrator 11. Specifically, in the second detection vibration mode, the weights 32A and 32D and the weights 32B and 32C are displaced in the opposite directions parallel or substantially parallel to the z-axis. Consequently, the drive beam portions 14A and 14D, to which the respective weights 32A and 32D are provided, and the drive beam portions 14B and 14C, to which the respective weights 32B and 32C are provided, vibrate so as to curve in the opposite directions parallel or substantially parallel to the z-axis. Accordingly, the left detection beam 22 and the right detection beam 23 of the detection beam portion 13B and the left detection beam 22 and the right detection beam 23 of the detection beam portion 13D vibrate so as to curve in the opposite directions parallel or substantially parallel to the z-axis.

As a result, the base-end detection beam 24 of the detection beam 13B and the base-end detection beam 24 of the detection beam 13D vibrate so as to curve in opposite phases. This causes the piezoelectric detection elements PD1 and PD2 to contract when the piezoelectric detection elements PB1 and PB2 expand and causes the piezoelectric detection elements PD1 and PD2 to expand when the piezoelectric detection elements PB1 and PB2 contract. In this way, a voltage having one polarity is generated in the piezoelectric detection elements PB1 and PB2, and a voltage having the opposite polarity is generated in the piezoelectric detection elements PD1 and PD2, in the second detection vibration mode.

By differential amplification between the voltage generated in the piezoelectric detection elements PD1 and PD2 and the voltage generated in the piezoelectric detection elements PB1 and PB2, a voltage signal corresponding to the angular velocity around the y-axis is obtained. Note that the piezoelectric detection elements PB1, PB2, PD1, and PD2 may be arranged in any manner as long as such voltages having the opposite polarities can be generated in the second detection vibration mode.

The piezoelectric detection elements PA3, PB3, PC3, and PD3 are provided to measure the angular velocity around the z-axis. The piezoelectric detection element PA3 is provided over the left detection beam 22, the base-end detection beam 24, and the right detection beam 23 of the detection beam portion 13A. The piezoelectric detection element PA3 extends in the radial direction of the detection beam 13A in a region on the right of the beam-width-direction center in the left detection beam 22 and extends in the radial direction of the detection beam portion 13A in a region on the left of the beam-width-direction center in the right detection beam 23.

The piezoelectric detection element PB3 is provided over the left detection beam 22, the base-end detection beam 24, and the right detection beam 23 of the detection beam portion 13B. The piezoelectric detection element PB3 extends in the radial direction of the detection beam 13B in a region on the right of the beam-width-direction center in the left detection beam 22 and extends in the radial direction of the detection beam portion 13B in a region on the left of the beam-width-direction center in the right detection beam 23.

The piezoelectric detection element PC3 is provided over the left detection beam 22, the base-end detection beam 24, and the right detection beam 23 of the detection beam portion 13C. The piezoelectric detection element PC3 extends in the radial direction of the detection beam 13C in a region on the right of the beam-width-direction center in the left detection beam 22 and extends in the radial direction of the detection beam portion 13C in a region on the left of the beam-width-direction center in the right detection beam 23.

The piezoelectric detection element PD3 is provided over the left detection beam 22, the base-end detection beam 24, and the right detection beam 23 of the detection beam portion 13D. The piezoelectric detection element PD3 extends in the radial direction of the detection beam 13D in a region on the right of the beam-width-direction center in the left detection beam 22 and extends in the radial direction of the detection beam portion 13D in a region on the left of the beam-width-direction center in the right detection beam 23.

When the angular velocity around the z-axis acts on the vibrator 11 vibrating in the drive vibration mode, a Coriolis force in the right or left direction perpendicular or substantially perpendicular to the radial direction of the plate surface in the plate surface occurs in the weights 32A to 32D, each of which is driven to vibrate in the radial direction perpendicular or substantially perpendicular to the axis around which the angular velocity acts. By the action of the Coriolis force, the vibrator 11 is excited so as to vibrate in a third detection vibration mode.

The weight 32A and the weight 32D vibrate in the respective radial directions in opposite phases in the drive vibrations, and hence the directions in which the Coriolis force acts on the weight 32A and the weight 32D are opposite to each other. The weight 32A and the weight 32C vibrate in the respective radial directions in the same phase, and hence the directions in which the Coriolis force acts on the weight 32A and the weight 32C are the same. The weight 32A and the weight 32B vibrate in the respective radial directions in the opposite phases, but the directions in which the Coriolis force acts on the weight 32A and the weight 32B are opposite to each other. The weight 32C and the weight 32D vibrate in the respective radial directions in opposite phases, and hence the directions in which the Coriolis force acts on the weight 32C and the weight 32D are opposite to each other. As a result, in the third detection vibration mode, the weights 32B and 32D are displaced so as to rotate in a counterclockwise direction around the z-axis when the weights 32A and 32C rotate in a clockwise direction around the z-axis, and the weights 32B and 32D are displaced so as to rotate in a clockwise direction around the z-axis when the weights 32A and 32C rotate in a counterclockwise direction around the z-axis.

As a result, the drive beam portions 14A and 14C, to which the weights 32A and 32C are provided, vibrate so as to rotate in the same direction around the z-axis. Meanwhile, the drive beam portions 14B and 14D, to which the weights 32B and 32D are provided, vibrate so as to rotate in the same direction around the z-axis. At the same time, the drive beam portions 14A and 14C and the drive beam portions 14B and 14D vibrate so as to rotate in the opposite directions around the z-axis.

As a result, each of the drive beam portions 14A to 14D, which are respectively connected to the detection beam portions 13A to 13D, rotates in the direction opposite to that of the adjacent drive beam. Accordingly, the detection beam portions 13A to 13D vibrate for detection so that the left detection beam 22 and the right detection beam 23 of each of the detection beam portions 13A to 13D come close to each other and become apart from each other. More specifically, the drive beam portions 14B and 14D vibrate so that the left detection beam 22 and the right detection beam 23 come close to each other when the drive beam portions 14A and 14C vibrate so that the left detection beam 22 and the right detection beam 23 become apart from each other, and the drive beam portions 14B and 14D vibrate so that the left detection beam 22 and the right detection beam 23 become apart from each other when the drive beam portions 14A and 14C vibrate so that the left detection beam 22 and the right detection beam 23 come close to each other.

In this way, voltages having opposite polarities are generated in each two adjacent ones of the piezoelectric detection elements PA3, PB3, PC3, and PD3, which are respectively provided in the detection beam portions 13A to 13D. By differential amplification between the voltages in each two adjacent ones of the piezoelectric detection elements PA3, PB3, PC3, and PD3, a voltage signal corresponding to the angular velocity around the z-axis is obtained.

In the third detection vibration mode, the detection vibrations transmitted from the left detection beam 22 and the detection vibrations transmitted from the right detection beam 23 in the opposite phases cancel each other out in the joining portion 25 of each of the detection beam portions 13A to 13D. This significantly reduces detection vibrations transmitted from the joining portions 25 to the central base portion 12 via the base-end detection beams 24 such that the energy of the detection vibrations is prevented from escaping from the central base portion 12. Moreover, even when the support substrate (external structure), to which the central base portion 12 is fixed, is deformed or vibrates by stress, the vibrator 11 is unlikely to vibrate in the third detection mode as a result of the deformation or the vibrations. Hence, the detection sensitivity and the detection accuracy of the angular velocity sensor 10 are further improved, and changes in the characteristics of the angular velocity sensor 10 are prevented.

In the third detection vibration mode, the left detection beam 22 of each of the detection beam portions 13A to 13D curves by a force transmitted from a corresponding one of the drive beams 33A to 33D of the drive beam portions 14A to 14D, the left detection beam 22 and the corresponding one of the drive beams 33A to 33D being perpendicular or substantially perpendicularly connected to each other. Meanwhile, the right detection beam 23 curves by a force transmitted from the corresponding one of the drive beams 31A to 31D of the drive beam portions 14A to 14D, the right detection beam 23 and the corresponding one of the drive beams 31A to 31D being perpendicular or substantially perpendicularly connected to each other. This allows the left detection beam 22 and the right detection beam 23 to efficiently come close to each other and become away from each other in each of the detection beam portions 13A to 13D and to largely deform.

The angular velocity sensor 10 according to a preferred embodiment of the present invention preferably has the above-described configuration and capable of individually measuring the angular velocities around the three respective axes of the Cartesian coordinate system. Moreover, the detection vibrations of the vibrator 11 caused by an angular velocity around the z-axis are kept within the drive beam portions 14A to 14D and the detection beam portions 13A to 13D, for example, and are hence unlikely to transmitted to the support substrate via the central base portion 12. This enables the angular velocity sensor 10 to have high vibration efficiency in terms of drive vibrations and detection vibrations as well as high detection sensitivity and detection accuracy. Further, it is unlikely that any stress or vibrations applied to the support substrate affect drive vibrations or detection vibrations, consequently enabling the angular velocity sensor 10 to have high detection sensitivity and detection accuracy. Further, it is unlikely that changes in stress applied to the support substrate or temperature changes affect drive vibrations or detection vibrations, consequently enabling little change in the characteristics of the angular velocity sensor 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An angular velocity sensor that measures an angular velocity based on a detection vibration generated by an action of a Coriolis force in a vibrator driven to vibrate along a plate surface of the vibrator, the vibrator comprising:
    a central base portion that is fixed at a center of the plate surface;
    four detection beam portions that are equiangularly arranged and extend from the central base portion in respective radial directions in the plate surface; and
    four drive beam portions each of which is located between and connected to adjacent ones of the four detection beam portions and each of which is provided with a weight; wherein
    each of the four detection beam portions includes:
        a base-end detection beam that is connected at a radial-direction inner end portion thereof to the central base portion;
        a first-direction-side detection beam that is connected, at a radial-direction inner end portion thereof, to the base-end detection beam and that is connected, at a radial-direction outer end portion thereof, to one of the drive beam portions adjacent to the detection beam portion in a first direction perpendicular or substantially perpendicular to the radial direction in the plate surface; and
        a second-direction-side detection beam that is connected, at a radial-direction inner end portion thereof, to the base-end detection beam and that is connected, at a radial-direction outer end portion, to one of the drive beam portions, the drive beam portion being adjacent to the detection beam portion in a second direction opposite to the first direction; and
    the vibrator is configured to be driven to vibrate so that the four drive beam portions are displaced in the respective radial directions and so that each two facing ones of the drive beam portions are in an identical phase and each two adjacent ones of the drive beam portions are in opposite phases.

2. The angular velocity sensor according to claim 1, wherein the angular velocity sensor detects a detection vibration of the vibrator in which the four drive beam portions rotate around an axis perpendicular or substantially perpendicular to the plate surface and in which each two facing ones of the drive beam portions are in an identical phase and each two adjacent ones of the drive beam portions are in opposite phases.

3. The angular velocity sensor according to claim 1, wherein the angular velocity sensor detects a detection vibration of the vibrator in which each two facing ones of the drive beam portions are displaced in a direction perpendicular or substantially perpendicular to the plate surface.

4. The angular velocity sensor according to claim 1, further comprising:
    a piezoelectric drive element that drives the vibrator to vibrate; and
    a piezoelectric detection element that detects the detection vibration of the vibrator.

5. The angular velocity sensor according to claim 4, further comprising a piezoelectric monitoring element that detects a drive vibration of the vibrator in order to control a drive voltage of the piezoelectric drive element.

6. The angular velocity sensor according to claim 1, wherein the vibrator includes a single substrate.

7. The angular velocity sensor according to claim 6, wherein the substrate is made of a semiconductor wafer.

8. The angular velocity sensor according to claim 1, wherein the central base portion has a square or substantially square shape.

9. The angular velocity sensor according to claim 8, wherein each of the four detection beam portions is located at a respective one of four corners of the square or substantially square shape.

10. A vibrator comprising:
    a plate surface;
    an angular velocity sensor configured to measure an angular velocity based on a detection vibration generated by an action of a Coriolis force when the vibrator is driven to vibrate along the plate surface;
    a central base portion that is fixed at a center of the plate surface;
    four detection beam portions that are equiangularly arranged and extend from the central base portion in respective radial directions in the plate surface; and
    four drive beam portions each of which is located between and connected to adjacent ones of the four detection beam portions and each of which is provided with a weight; wherein
    each of the four detection beam portions includes:
        a base-end detection beam that is connected at a radial-direction inner end portion thereof to the central base portion;
        a first-direction-side detection beam that is connected, at a radial-direction inner end portion thereof, to the base-end detection beam and that is connected, at a radial-direction outer end portion thereof, to one of the drive beam portions adjacent to the detection beam portion in a first direction perpendicular or substantially perpendicular to the radial direction in the plate surface; and
        a second-direction-side detection beam that is connected, at a radial-direction inner end portion thereof, to the base-end detection beam and that is connected, at a radial-direction outer end portion, to one of the drive beam portions, the drive beam portion being adjacent to the detection beam portion in a second direction opposite to the first direction; and
    the vibrator is configured to be driven to vibrate so that the four drive beam portions are displaced in the respective radial directions and so that each two facing ones of the drive beam portions are in an identical phase and each two adjacent ones of the drive beam portions are in opposite phases.

11. The vibrator according to claim 10, wherein the angular velocity sensor detects a detection vibration of the vibrator in which the four drive beam portions rotate around an axis perpendicular or substantially perpendicular to the plate surface and in which each two facing ones of the drive beam portions are in an identical phase and each two adjacent ones of the drive beam portions are in opposite phases.

12. The vibrator according to claim 10, wherein the angular velocity sensor detects a detection vibration of the vibrator in which each two facing ones of the drive beam portions are displaced in a direction perpendicular or substantially perpendicular to the plate surface.

13. The vibrator according to claim 10, further comprising:
   a piezoelectric drive element that drives the vibrator to vibrate; and
   a piezoelectric detection element that detects the detection vibration of the vibrator.

14. The vibrator according to claim 13, further comprising a piezoelectric monitoring element that detects a drive vibration of the vibrator in order to control a drive voltage of the piezoelectric drive element.

15. The vibrator according to claim 10, wherein the vibrator includes a single substrate.

16. The vibrator according to claim 15, wherein the substrate is made of a semiconductor wafer.

17. The vibrator according to claim 10, wherein the central base portion has a square or substantially square shape.

18. The vibrator according to claim 17, wherein each of the four detection beam portions is located at a respective one of four corners of the square or substantially square shape.

* * * * *